United States Patent
Storey

(10) Patent No.: US 7,920,369 B2
(45) Date of Patent: Apr. 5, 2011

(54) APPARATUS AND METHOD FOR NANO PLASMA DEPOSITION

(75) Inventor: Daniel M. Storey, Longmont, CO (US)

(73) Assignee: Metascape, LLC., Maple Grove, MN (US)

( * ) Notice: Subject to any disclaimer, the term of this patent is extended or adjusted under 35 U.S.C. 154(b) by 1108 days.

(21) Appl. No.: 11/657,222

(22) Filed: Jan. 23, 2007

(65) Prior Publication Data

US 2008/0095952 A1   Apr. 24, 2008

Related U.S. Application Data

(60) Provisional application No. 60/857,431, filed on Nov. 7, 2006, provisional application No. 60/852,773, filed on Oct. 18, 2006.

(51) Int. Cl.
   *F23Q 3/00* (2006.01)
(52) U.S. Cl. ........................................ 361/253
(58) Field of Classification Search ............ 361/253
   See application file for complete search history.

(56) References Cited

U.S. PATENT DOCUMENTS

| | | | |
|---|---|---|---|
| 5,037,522 A | 8/1991 | Vergason | |
| 5,351,162 A * | 9/1994 | Koishikawa | ............... 361/18 |
| 5,441,624 A | 8/1995 | Chan et al. | |
| 5,773,883 A * | 6/1998 | Majumdar et al. | ............ 257/698 |
| 5,855,745 A * | 1/1999 | Manley | ............. 204/192.12 |
| 5,892,279 A * | 4/1999 | Nguyen | ............... 257/712 |
| 6,036,828 A | 3/2000 | Beers et al. | |
| 6,062,163 A | 5/2000 | Patrick et al. | |
| 6,103,074 A | 8/2000 | Khominich | |
| 6,936,145 B2 | 8/2005 | Sunthankar et al. | |
| 7,586,766 B2 * | 9/2009 | Ikeda et al. | ............... 363/65 |
| 2002/0146508 A1 * | 10/2002 | Bacon et al. | .............. 427/180 |
| 2005/0233551 A1 * | 10/2005 | Bergstrom et al. | ............ 438/478 |

OTHER PUBLICATIONS

Boxman, R.L., et al., "Macroparticle contamination in cathodic arc coatings: generation, transport and control", *Surface and Coatings Technology*, 1992, pp. 39-50, vol. 52.

* cited by examiner

*Primary Examiner* — Ronald W Leja

(74) *Attorney, Agent, or Firm* — Saliwanchik, Lloyd & Eisenschenk

(57) ABSTRACT

An apparatus and method for initiation and control of a sustained metal plasma and nano plasma (macroparticulate) deposition methods for preparing modified metal coatings are provided. The plasma deposition process can be tightly controlled by virtue of a device that incorporates a plasma arc initiator component and an internal power supply that is capable of controlling dwell time on the target and the size range of particles ejected in the plasma arc.

11 Claims, 6 Drawing Sheets

APPARATUS AND METHOD FOR NANO PLASMA DEPOSITION

CROSS REFERENCE TO RELATED APPLICATIONS

This application claims benefit of U.S. provisional application Ser. No. 60/857,431, filed Nov. 7, 2006 and U.S. provisional application Ser. No. 60/852,773, filed Oct. 18, 2006, the contents of both incorporated herein in their entirety.

BACKGROUND OF THE INVENTION

1. Field of the Invention

The subject invention pertains to an apparatus and method for initiation of a plasma, in particular a plasma initiator and power distribution system.

2. Description of Background Art

High current power processes are recognized as being relatively dirty due to the lack of precise control over power output. Efforts to improve control over high power processes have for the most part been focused on power delivery in welding processes. Various external mechanisms have been devised in attempts to reduce inconsistencies in output. While some success has been achieved in reducing problems associated with mechanical malfunctions, total dynamic control over power output remains a challenge.

Ionic Plasma Deposition (IPD) is a basic technology employed in coating and other processes where a plasma is deposited on a substrate. The method has been adapted to some extent to modify metal surface coatings by controlling the size and density of plasma particles. A metal plasma produced by this method is generated from a cathode target onto a substrate, which acts as the anode. Several methods have been used to initiate the arc, most using some type of mechanical device, which unfortunately tends to be susceptible to high failure rates. The resulting loss in time and productivity are a particular concern in manufacturing operations.

Nano or macroparticle deposition processes are increasingly of interest because of the need to control surface textures and the importance of surface coatings in medical devices. Cell attachment for example is important in certain types of implants, while in other applications, the control of surface texture may directly affect function. In addition to functionality, some commercial products may depend on a blemish free appearance for success in the marketplace. Highly controlled deposition of nanoparticulate surfaces is believed to have the potential to produce superior surfaces free of blemishes and to offer ways to customize functionality based on surface topography. So far, reproducible nanoparticulate surfaces have been difficult, if not impractical, to achieve with current technology.

Nano plasma deposition (NPD), like ionic plasma deposition, requires plasma initiation, arc control and source utilization. Initiation of the plasma arc as currently practiced, typically utilizes a mechanically driven device. An exemplary type of initiator, also termed a trigger or striker, is a rod made of tungsten or similar material connected to the anode, which is connected to a mechanical device that brings the rod in momentary contact with the target. The process produces varying levels of contamination from the plasma trigger material because the trigger is exposed to high temperatures at the target. The vaporized material contaminates the target, substrate(s) and even the vacuum system itself. Failure of the device is a frequent occurrence, making the system generally unreliable.

One type of initiator or striker is described in U.S. Pat. No. 6,936,145. A ceramic striker pre-plated with a thin metallic film is attached directly to the negatively biased target. An input lead is then attached to one end of the striker so that the lead is in contact with the metallic film. The input lead is grounded through a normally "open" mechanical switch controlled by a relay coil. When a timed control power is applied to the relay coil it is momentarily activated and the switch closes. A limiting current, approximately 10 amps, flows through the plated ceramic striker causing an arc to be struck or initiated. The transient current that initiates the arc burns the thin-coated plating/coating away from the striker. While there is no mechanical movement of the striker in this system, a relay on the outside of the vacuum chamber is required to momentarily short it to ground or to the anode. The grounding puts stress on the mechanical relay, frequently causing the relay contacts to weld together. Large amounts of current are then drawn through the contacts, which may cause damage to the relay. Additionally, due to the nature of this circuit, the ceramic has a tendency to heat, break and in some cases, melt.

A "trigerless" initiator is described in U.S. Pat. No. 6,465,793. The device is described as having no moving parts internal to the plasma chamber although there are many external components. The initiator utilizes a stand alone power supply that is different and separate from the power supply to the target used to generate the plasma. Power speed is controlled within specific parameters (one to 300 cycles per second range), but relies on external switching using a mechanical switch that has proven not to be robust.

Most initiators are designed to vaporize the coating on a non-conductive substrate prior to initiation of the plasma in the belief that it is necessary to break contact between plasma and substrate before deposition occurs. Unfortunately, this has the effect of increasing the time required between initiating the plasma. In particular, it is difficult to perform a short deposition or quick on/off pulses using such prior art initiators.

Current nano plasma deposition methods, such as physical vapor deposition (PVD), also lack the ability to control the arc that creates the metallic plasma. Basic PVD, because it has little or no control, deposits macro particle in a large range of sizes and shapes. These particles can range in size from a few angstroms to tens of microns in diameter. Without power control, the plasma generation source can dwell in one spot for an unspecified amount of time. The longer power stays in one spot, the larger the macroparticles produced. The average size of the macroparticles in an uncontrolled power process then becomes primarily dependant on the melting point of the material. Chrome, for example, with a melting point of just above 1900° C. has an average macro particle size of one micron in an uncontrolled process. Aluminum, on the other hand, with a melting point of 660° C., has an average macro particle size of just over 10 microns under the same process conditions.

In general, plasma deposition processes in current practice rely on a trigger that must be physically moved to come into contact with the target, has a high failure rate because of local overheating, fusing of critical weld points or simply is unable to sustain a controlled deposition rate. Most triggers are highly susceptible to breakdown and failure.

Accordingly, plasma initiators in current use are dependent on some type of mechanical device and require isolation of the positive and negative terminals of a plasma source. The mechanical device is normally placed outside the plasma chamber and consists of a mechanical relay that momentarily shorts the positive and negative terminals. Such an arrangement is generally unreliable because several problems can arise after the short occurs and the relay attempts to separate to break the connection.

For example, the contactor may actually fuse, thereby preventing separation of the connection between the positive and negative terminals. This can cause the relay to overheat when the full current, usually in excess of 100 amps, is passed through the contactor, which typically is rated for only 10 amps.

Burning of the contacts can also occur due to an arc drawn between the positive and negative terminals of the plasma source. The arc can foul the contactor and thus the momentary connection needed to initiate the plasma cannot be made without maintenance to the relay.

If the plasma is extinguished or interrupted, it can be re-initiated only if the metal plasma has been depositing for longer than about 30 seconds. The initiator inside the chamber will need to be re-coated by metal because the initiation is dependent on the thin metallic film being vaporized upon initiation.

A lack of effective controls for currently available power control systems is another problem encountered with nanoparticle deposition. While some power controls seem to address to at least some of the deficiencies, the application may be limited. For example, U.S. Pat. No. 5,037,522 describes a method of power control using sensors to detect the power at the end of a cylindrical target. Unfortunately, this technology is viable only using a cylindrical target setup as illustrated in the '522 patent. This limits the use of the power supply since the actual source configuration of the metallic vapors is a factor in controlling nano particle size.

Presently available control systems only address the ability to prevent the power from dwelling in one spot too long. When a reduced macro particle coating is desired, these methods, though not perfect, while adequate for some applications, are unsatisfactory where controlled surface quality is needed. Medical device cell attachment coatings, for example, require not only an actual increase in the number of macroparticles, but also control of the size of deposited macroparticles. The external electronic controls that are currently available do not address this problem.

In general, therefore, the lack of precise control over output power in high current processes has limited development of methods for producing specialized surfaces that require defined surface structuring. While some control over power delivery has been achieved, mostly through the use of external control devices, little attention has been given to total dynamic control over power output. Plasma arc control methods are limited and require complex sensors and other electronics that generally are not sufficiently robust to withstand commercial use. Control of power speed has not been adequately addressed and little attention has been paid to eliminating power hanging in one spot on the target or to preventing the power from jumping around on the target surface.

BRIEF SUMMARY

Accordingly, embodiments of the subject plasma initiator can address several of the common problems encountered with mechanical or ceramic initiators in current use. In one embodiment, the plasma initiator includes: a solid state relay, a power supply including a power supply control unit, a resistor coupled between the solid state relay and the power supply, and a point of contact for a plasma source coupled to the negative side of the power supply. Resistors used for the subject plasma initiator can be sized such that they can handle the full amount of current. The point of contact, unlike in the prior art, can be made of metal, ceramic or any other conductive material and does not need to have a thin film covering that must be vaporized.

The initiator does not require an insulative material coated with a conductive material. It also does not require the coating to be vaporized, and thus contact between the anode and cathode does not need to be broken to initiate the plasma. There can be constant direct contact between the anode and cathode, thus initiating a lower energy plasma than previously achieved.

Accordingly, the initiator comprises a circuit that may overcome the problems associated with unreliable arc initiation processes, thus making the initiation process extremely reliable, repeatable and reusable. In addition, the subject circuit can be designed for the initiation and stable operation of the plasma at much lower current levels than are now required. For example, Boxman, et. al., Surface and Coatings Technology, 52:39-50; (1992) reported that the minimum current necessary to initiate and sustain a gold plasma is approximately 13 amps, for silver approximately 11.5 amps, and for copper, approximately 17 amps. In contrast, using the disclosed apparatus, metal plasmas can be initiated and sustained at around 5 amps. In addition, the current invention requires only 7 to 10 volts to sustain a stable plasma. This is in sharp contrast to the minimum voltages of 15 volts for gold, 13 volts for silver and 16 volts for copper reported by Boxman, et al. to sustain a stable plasma.

Advantageously, the circuit can be designed to be independent of location. Initiators in current use require the plasma to be in physical contact with the metal plasma source inside the vacuum chamber. In contrast, in an embodiment, the subject initiator can be used as part of a nano plasma deposition system and does not require direct contact with any internal parts of the plasma source. In the unlikely event a failure occurs, it may be easily and quickly repaired without breaking the vacuum. The plasma initiator does not require mechanical parts; is solid state, robust and reliable.

Control of Macro Particle Size

One of the major challenges in any plasma technology such as NPD is the ability to control and thus repeat and scaleup a process. With NPD, precise control over the power input, as is possible with the subject plasma initiator and power control apparatus, provides improved control over several parameters, including deposition rate, substrate heating and macro particle frequency and size. For medical applications, control over the macro particle size is particularly important because the size of the macroparticles will determine physical and functional properties of the surface, and control of particle size will determine the nature of the surface modification.

The need for macro particle control is particularly critical in the manufacture of surfaces intended as scaffolds for cell attachment. In order for specific cells to attach to a surface, it has been shown that the surface needs to be of a certain roughness. This can be achieved by macro particle deposition. The challenge was to be able to deposit the correct size macroparticles in a consistent manner to achieve the desired surface roughness. This can be accomplished through precise control of power speed. In one embodiment, the power supply control unit can include: at least one Insulated Gate Bipolar Transistor (IGBT), a DC power supply, and at least one control circuit. In embodiments, the subject power supply control unit not only can control the dwell time, but also can control the size range of the macroparticles ejected from a plasma target. In a specific embodiment, a particular target architecture can be provided having a three-dimensional pattern.

A particularly advantageous feature of the subject ion plasma deposition apparatus is the internal location of the power supply control unit. Thus, it is possible to not only control dwell time on the target but also to control the size range of the macroparticles ejected. Such control is not possible with the external electronic controls that are currently available.

The new power control system is different from the sensors currently in use. The switch of embodiments of the present invention does not rely on any external sensors or controls. It can be controllable in the one to 10,000 cycles per second range and may be expandable to a desired number of outputs. Additionally, due to the integrated controls, the supply can be extremely controllable and robust.

DEFINITIONS

Macroparticles, also termed nanoparticles, range in size from angstrom to several microns in size.

Ionic Plasma Deposition (IPD) is a method of creating highly energized plasma by using a vacuum arc discharge on a target material.

A plasma is an electrically neutral, highly ionized gas composed of ions, electrons, and neutral particles. It is a phase of matter distinct from solids, liquids, and normal gases.

The term "about" as used herein is intended to indicate that a particular number is not necessarily exact but may be higher or lower as determined by the particular procedure or method used.

Nano Plasma Deposition (NPD) is a method of creating highly energized plasma by using a vacuum arc discharge on a target material.

Plasma vapor deposition (PVD) is a thin film deposition process in the gas phase in which source material is physically transferred in a vacuum to a substrate surface without any chemical reactions involved. This type of deposition includes thermal evaporation Electron-beam deposition and sputtering deposition. The NPD process is a subtype of physical vapor deposition.

A plasma initiator, or striker, is a device that initiates a current at a cathode target so that where the current contacts the target, the target evaporates into a high energy plasma.

BRIEF DESCRIPTION OF THE DRAWINGS

FIG. 1B illustrates an application of the plasma arc initiator device of FIG. 1A.

FIG. 3A shows a single unit and FIG. 3B shows an expanded unit.

DETAILED DESCRIPTION OF THE INVENTION

Hereinafter, a power supply, including control unit and a plasma initiator device and methods of using the same according to exemplary embodiments of the present invention will be explained in detail with reference to accompanying drawings.

The subject control unit may be used with any power supply to form a power supply unit. In a specific embodiment, a main power supply unit can be used that supplies a constant current of up to at least 650 amps. The power supply can be fed to the control unit, which supplies the full current to different power taps on the power supply unit. These taps can be connected to various input connections on, for example, a NPD target. The control unit can supply the power to the taps by switching power from one tap to another in a pre-determined pattern. The pattern can be chaotic. In an embodiment, the switching can resemble a square wave pattern with very little overlap.

Power is controlled in specific ways. The plasma arc speed, sensed by the control module, can be varied to ensure the proper dwell time to deliver the correct average sized macroparticles. Power draw can also be monitored and controlled to further aid in the size control of the deposited plasma particles. Switching can ensure an evenly deposited coating of the proper surface roughness and even erosion of the target material, a positive and cost saving side effect of this control method. Finally, the ability to extend the amount of switching positions to no limit can allow the scaling of this power supply to be limited only by external considerations and not by the supply itself.

While the disclosed plasma initiator has been designed specifically for NPD, other applications can be contemplated, including welding applications that require more then one welder, sputtering applications and various other heating and industrial uses.

Figure 1A:
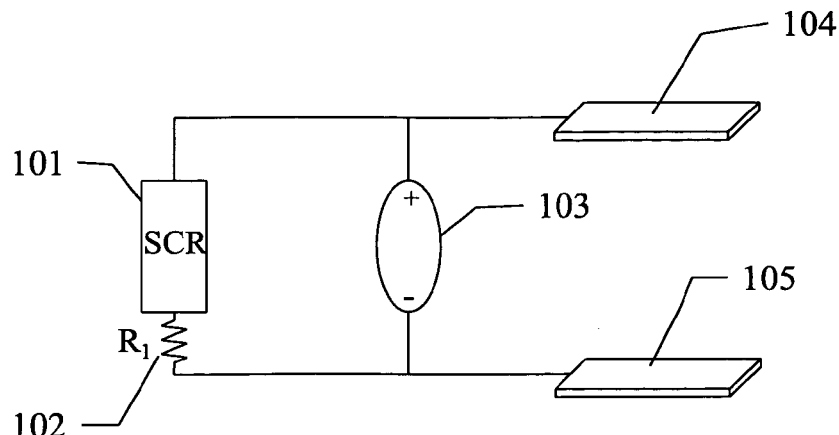
FIGS. 1A and 1B show a block diagram of a plasma arc initiator device according to an embodiment of the subject invention.
Figure 1B:
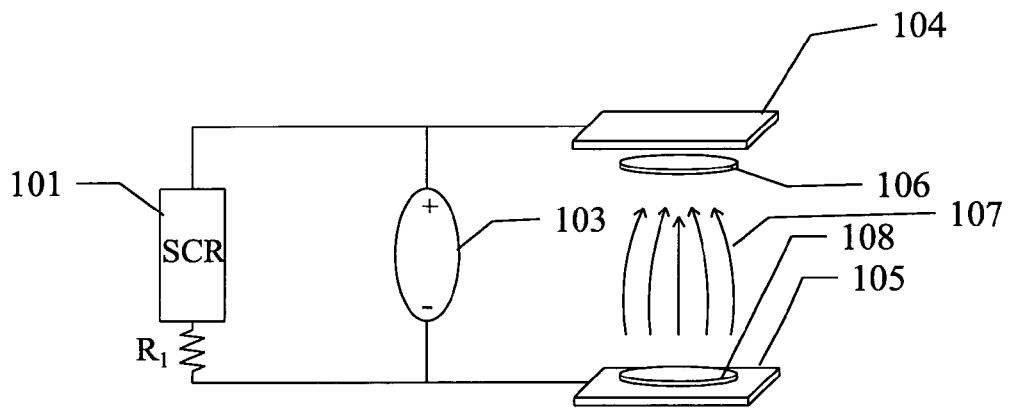
Figure 2:
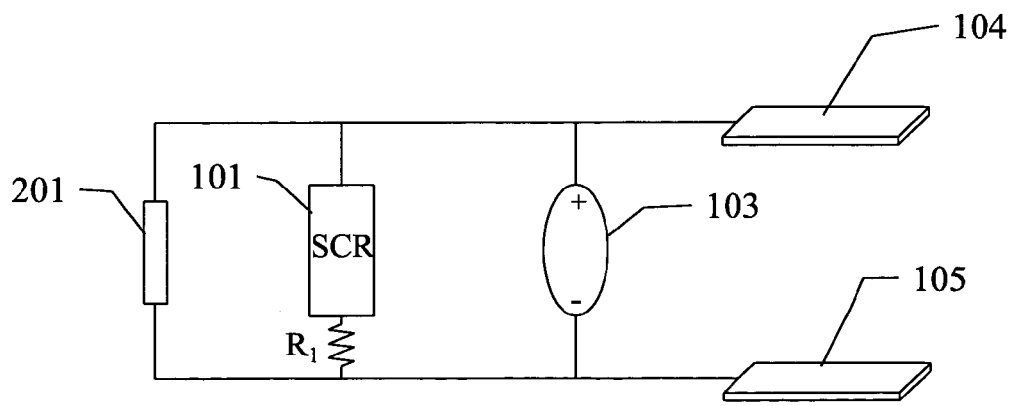
FIG. 2 shows a block diagram of a plasma arc initiator device according to another embodiment of the subject invention.

FIGS. 1A-1B and 2 show a schematic diagram of a plasma/arc initiation device according to embodiments of the present invention. Referring to FIG. 1A, a first end of a semiconductor relay (SCR) 101 can be coupled to a positive side of a power supply control unit 103 and an anode 104. The SCR is a normally 'open' relay. A second end of the SCR 101 can be coupled to a first end of a resistor 102 and a second end of the resistor 102 can be coupled to a negative side of the power supply control unit 103 and the cathode 105. In addition, the positive side of the power supply may be connected to ground.

In operation, the constant current power supply 103 can be energized, and the SCR 101 can be momentarily closed. Referring to FIG. 1B, a substrate 106 and a target 108 can be provided and contacted to the anode 104 and the cathode 105, respectively, in a chamber (not shown). The chamber can be pumped down to a predetermined level and Ar gas can be provided. A plasma arc can be initiated by applying a voltage to the anode 104 and supplying current to the target 108. The arc can produce plasma 107 and the plasma 107 can transfer and deposit the target material to the substrate 106. The resistance between the cathode 105 and the anode 104 begins as an infinite resistance because there is no plasma 107. Once the SCR is closed, the plasma is initiated and the resistance between the cathode 105 and the anode 104 can be reduced to micro-ohms.

In a further embodiment, as shown in FIG. 2, a material having a determined resistance 201 can be coupled to the power supply control unit 103 in parallel. In this embodiment example, the material having the determined resistance 201 must be slightly greater than or equal to the resistance between the cathode 105 and the anode 104 when plasma is formed. With this configuration, it is possible to run the plasma at much lower voltages and currents than predicted by Boxman, et. al. (Surface and Coatings Technology, 52:39-50; 1992). Running the plasma at a much lower power provides better control over macroparticle production in the plasma and slower deposition rates with the associated high energy plasma. This is a significant advantage over other devices in providing an entire control system that is internal to the supply and does not rely on any external sensors or controls. Power can be controllable in the one to 10,000 cycles per second range and may be expandable to a desired number of outputs. Due to the use of integrated controls, the supply is highly controllable and robust.

Figure 3A:
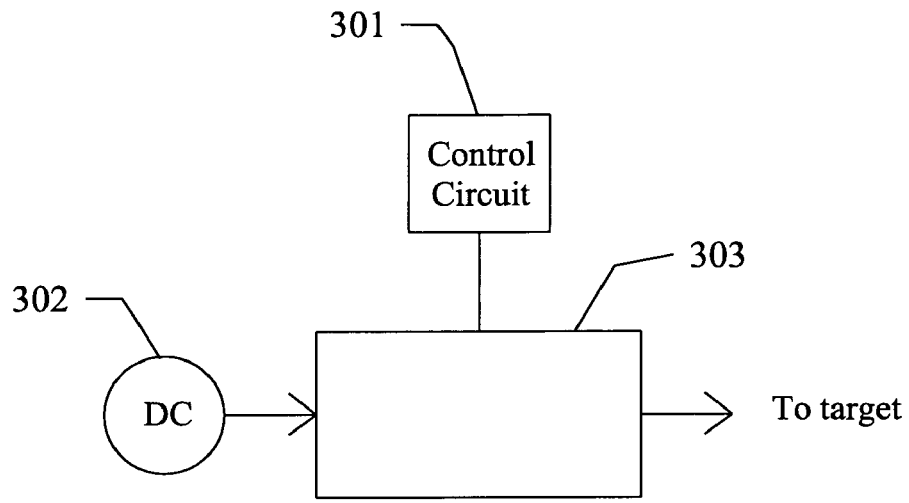
FIGS. 3A and 3B show a schematic diagram of a power supply for use in an embodiment of the subject invention.
Figure 3B:
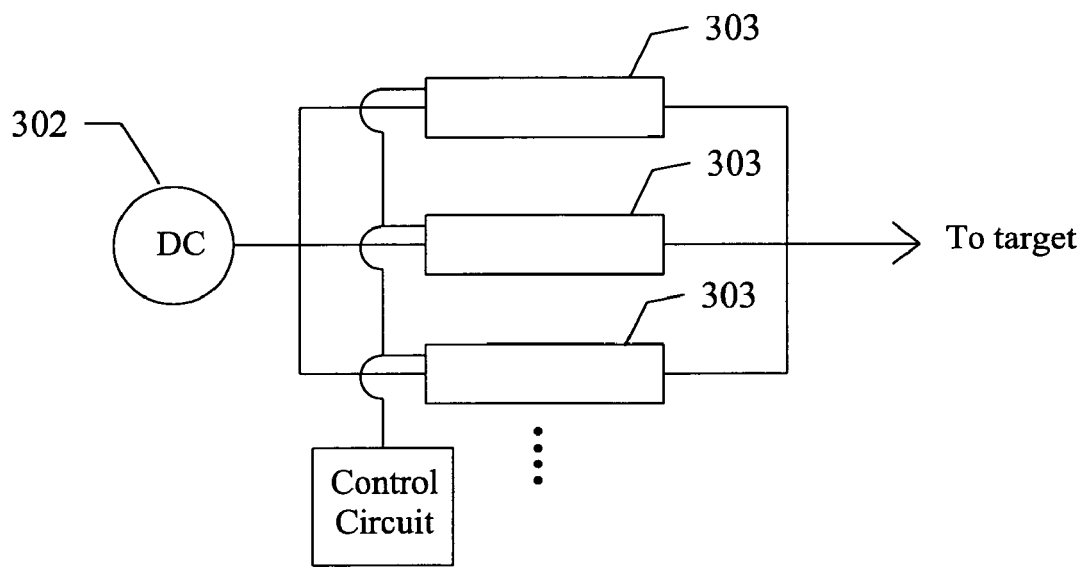

Referring to FIGS. 3A and 3B, the power supply control unit 103 can include a DC power supply 302, a control circuit 301, and at least one Insulated Gate Bipolar Transistor (IGBT) or Semiconductor Relay (SCR) 303. A first input of the at least one IGBT (or SCR) 303 can be coupled to the control circuit 301 and a second input of the at least one IGBT (or SCR) 303 can be coupled to the DC power supply 302. An output of the at least one IGBT (or SCR) 303 can be coupled to the target 108. As illustrated in FIG. 3B, the number of IGBTs (or SCRs) can be expandable. In an embodiment, each IGBT (or SCR) 303 can be cooled with corresponding cold plate. The DC power supply 302 can be a typical power supply that supplies power up to 600 A and 20 V. Depending on the application, one control circuit can be used for controlling all the IGBTs (or SCRs) 303, or a separate control unit can be used for each IGBT (or SCR) 303.

An all-in-one control/sensing/power supply device can control not only the single power output that is typical for most power supplies, but can also divide current between several outputs, sense power draw, and more efficiently use power. This is a significant improvement over similar devices currently used for plasma deposition processes. The new power supply device can improve the surface properties of plasma deposited metals, and is especially useful for the construction of highly controlled plasma deposited surfaces required for medical devices.

Figure 4A:
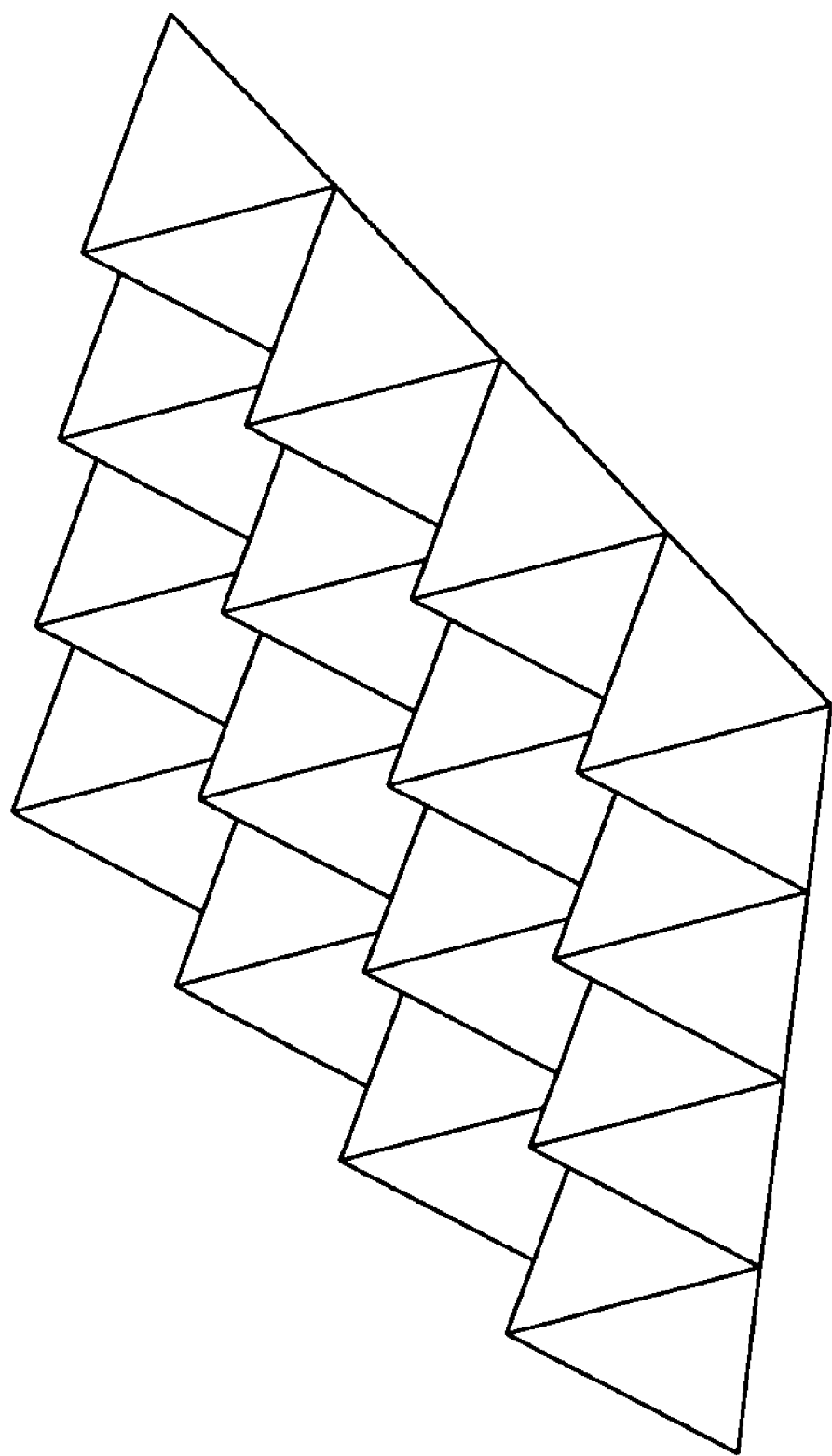
FIG. 4A shows a target pattern incorporating pyramid shapes in accordance with an embodiment of the subject invention.

Another method for controlling nanoparticle production can be accomplished by providing a target configured to produce a desired size and/or number of particles. Embodiments of this method are described in Example 5. The target may have a concave surface, a convex surface, or a flat surface. The target may further be patterned to form a particular architecture. For example, the target can be configured to include a pattern of diamonds or a pyramid pattern. In a specific embodiment involving a pyramid pattern as illustrated in FIG. 4A and described in Example 6, the target may have a pyramid which has an angle of the sides at 60° to the normal, and a length of one side of the base of the pyramid is 0.5 inch.

EXAMPLES

Example 1

Gold Deposition

An ion plasma deposition apparatus according to the exemplary embodiment of the subject invention as illustrated in FIG. 1 was used to deposit a gold coating on ultrahigh molecular weight polyethylene (UHMWPE). A gold plasma source 2"×4"×1" thick was placed in a vacuum chamber and pumped down to a level of 5E-4 Torr. The apparatus was attached to the target and energized at 5 amps and 10 volts for a total of 50 watts. This produced a plasma that deposited gold on a substrate positioned 8" from the target at the rate of 5 nanometers per minute. The plasma was sustained for 60 minutes and then extinguished by the operator. Similar conditions were used to deposit gold on a gold or titanium substrate.

Example 2

Titanium Deposition

The ion plasma deposition apparatus was used to deposit a titanium coating on ultrahigh molecular weight polyethylene (UHMWPE). A titanium plasma source 2"×4"×1" thick was placed in a vacuum chamber and pumped down to a level of 5E-4 Torr. The apparatus was attached to the target and energized at 7 amps and 12 volts for a total of 84 watts. This produced a plasma that deposited titanium on a substrate positioned 8" from the target at the rate of 3 nanometers per minute. The plasma was sustained for 60 minutes and then extinguished by the operator. Similar conditions were used to deposit titanium on a gold or titanium substrate.

Example 3

Deposition of Titanium on Aluminum Oxide

An example of the power switching mechanism, illustrated in FIGS. 3A and 3B, which was used in Examples 1 and 2 includes a computer controlled timing circuit that is commercially available. Here, a soft PLC (programmable logic controller) was used as the timing circuit. The circuit can output timing pulses in excess of 500 Hz. The timing circuit drives include two banks of solid state relays (SSRs of SCRs). Each SSR can switch up to 500 Hz and handle up to 50 amps each. The SSRs were placed in parallel (as illustrated in FIG. 3B) and each bank expanded to handle an infinite amount of current. The SSR banks were placed on a water cooled cold plate to ensure proper cooling and operation. With a plasma initiator according to the exemplary embodiment in place on the metallic plasma source, a 99.99% pure titanium plate that was 6" by 20" by 1" thick, and the timing PLC set to switch the current at a rate of 250 Hz, 200 amps from the power supply was supplied to the two SSR banks. The banks were attached to their respective power posts on the metallic target.

Figure 5:
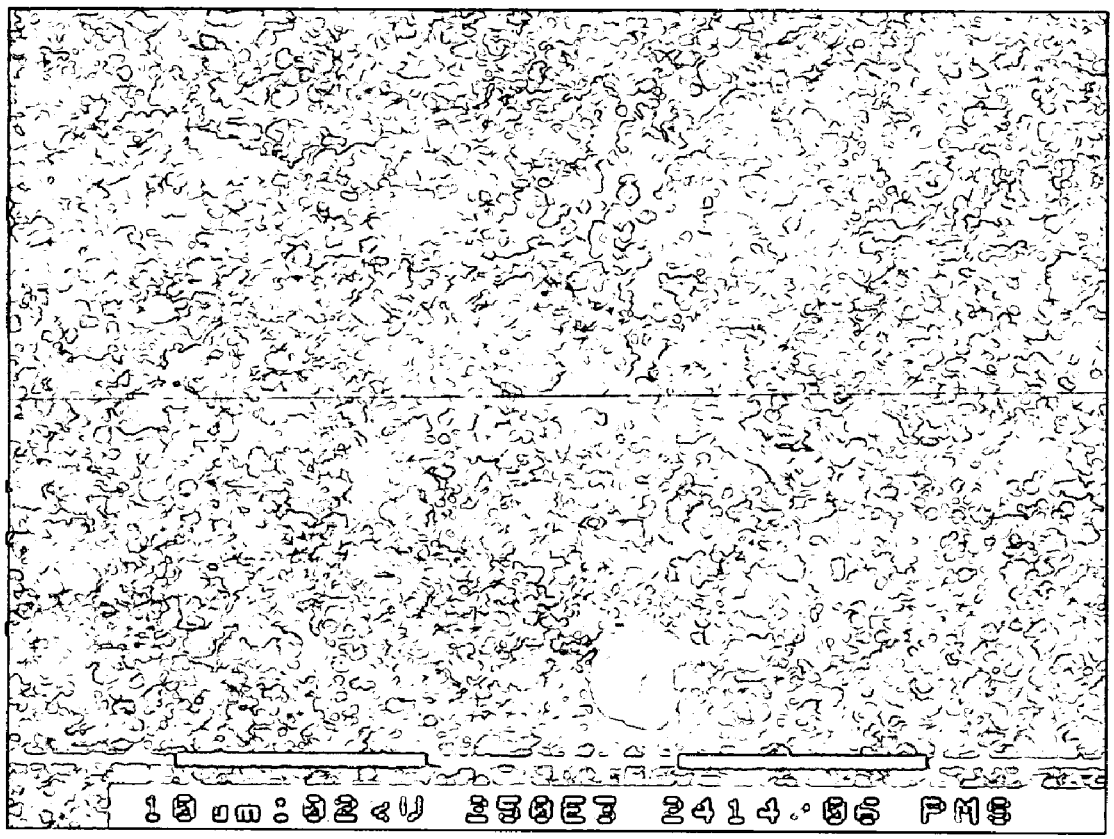
FIG. 5 is a scanning electron micrograph (SEM) of a titanium coating deposited on an aluminum oxide substrate using the plasma initiator and power controlled IPD apparatus according to an embodiment described herein.

The plasma chamber was evacuated to a pressure of 4E-4 Torr, then backfilled with 99.99% pure argon gas at a flow rate of 500 SCCM to bring the chamber pressure up to 5E-3 Torr. The power supply and PLC were activated as described and the plasma automatically initiated. The plasma was allowed to deposit for ten minutes on an aluminum oxide substrate positioned 24" from the face of the plasma source. The chamber was vented to atmosphere and the sample was removed and analyzed by SEM. FIG. 5 shows the result of the SEM. Results showed that the deposited coating contained a majority (greater than 75%) of nanoparticles in the range of 30 to 40 nanometers. Ten percent of the nanoparticles were less then 30 nanometers, ten percent were between 40 nanometers and one micron, and five percent were greater than one micron.

Example 4

Deposition of Titanium on Aluminum Oxide

With the plasma initiator according to the exemplary embodiment in place on the metallic plasma source, in this case, a 99.99% pure titanium plate that was 6" by 20" by 1" thick, and the timing PLC set to switch the current at a rate of 400 Hz, 200 amps from the power supply is supplied to the two SSR banks and the banks are attached to their respective power posts on the metallic target.

Figure 6:
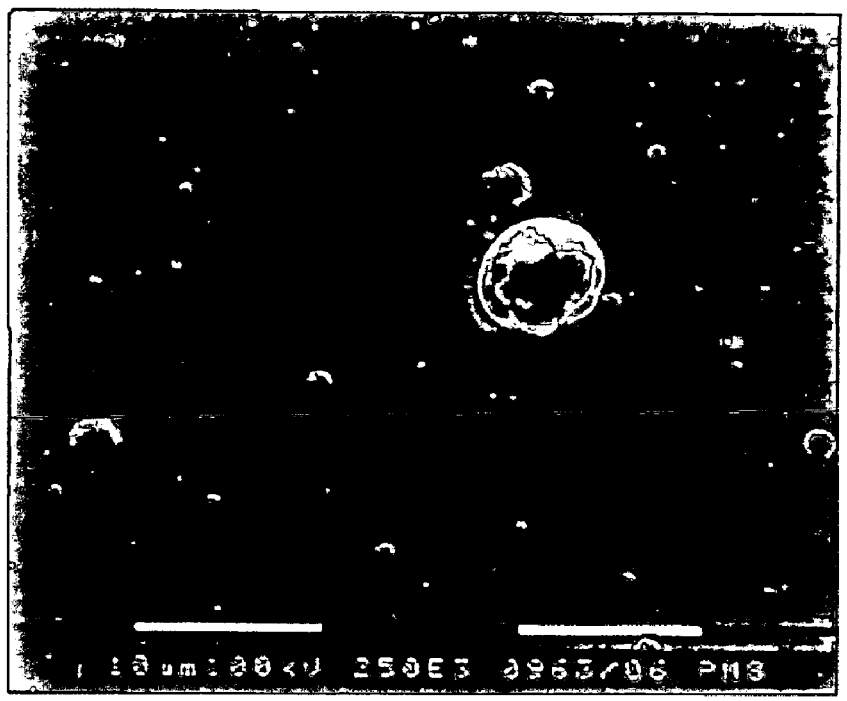
FIG. 6 is a scanning electron micrograph (SEM) of a titanium coating deposited on an aluminum oxide substrate using the plasma initiator and power controlled IPD apparatus according to another embodiment described herein.

The plasma chamber is evacuated to a pressure of 4E-4 Torr, then backfilled with 99.99% pure argon gas at a flow rate of 500 SCCM to bring the chamber pressure up to 5E-3 Torr. The power supply and PLC was activated at the above parameters and the plasma was automatically initiated. The plasma was allowed to deposit on an aluminum oxide substrate that was 24" from the face of the plasma source for ten minutes. The chamber was vented to atmosphere and the sample was removed and analyzed by SEM. FIG. 6 shows the result of the SEM. The coating from the plasma was found to contain a majority (greater than 85%) of nanoparticles in the range of 10 to 20 nanometers. Five percent of the nanoparticles were assumed to be less then 10 nanometers due to resolution at that level, eight percent were between 20 nanometers and one micron, and two percent were greater then one micron.

Example 5

Plasma Source/Target Configuration

Figure 4C:
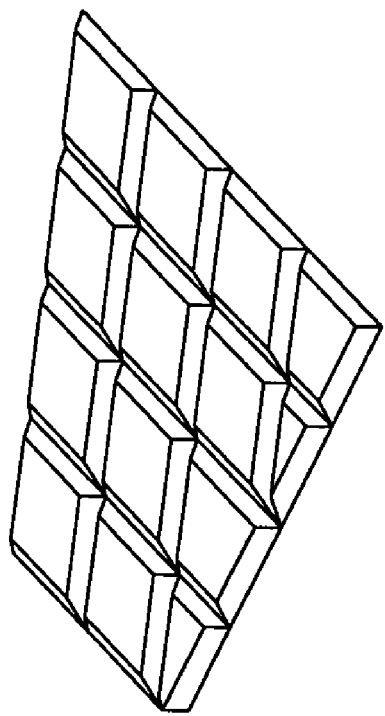
FIGS. 4B and 4C show another target pattern incorporating diamond shapes in accordance with an embodiment of the subject invention.
Figure 4B:
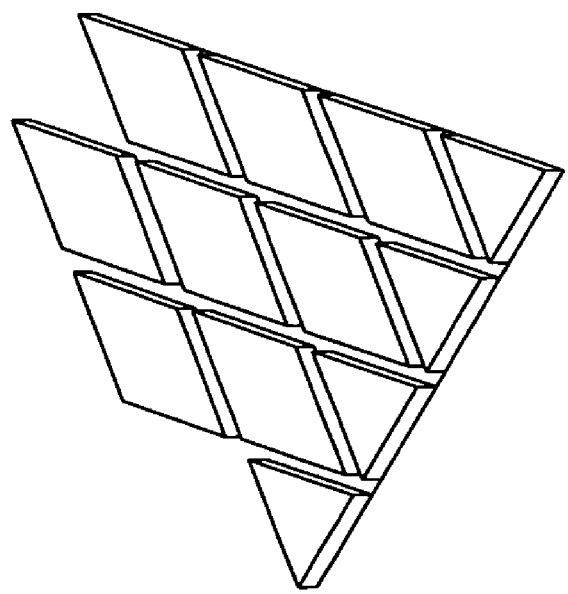

IPD of a metal plasma can be achieved using an apparatus equipped with the power control and initiator shown in FIG. 1. Although the operation of these two circuits is not dependent on the configuration of the source, NPD metal coatings are improved if the surface of the source (target) is contoured and/or given a specific shape such as flat face versus a concave face or convex face. Each type of surface geometry can enhance the control over nano particle production. FIGS. 4A and 4B illustrate examples of surface geometry that can be used in embodiments of the subject invention.

Surface patterning, in addition to source configuration, can affect nano particle production. Depending on target material and size, most ion plasma deposition processes require at least a 30 sec deposition. This relatively long time of exposure to a plasma may cause significant deformation of the substrate.

It is well documented that most (>80%) of the nanoparticles produced by processes similar to the NPD process are ejected into the plasma from the source at an angle of 20° or less perpendicular to the target. If the goal of the NPD process is to completely eliminate all particles larger than some arbitrary size (such as all nanoparticles greater then 1 nanometer), a machined, flat faced source (no curvature) can be used with the apparatus described above.

If deposition of a large number of large nanoparticles (>50 nanometers) is desired, in one embodiment, a patterned surface of diamonds on the surface at a height of ideally between about 1 inch and about ¾ inch tall and an angle normal to the surface of about between 20 and 60° can be employed. FIGS. 4B and 4C show examples of a patterned diamond surface.

Example 6

Deposition of Titanium on Aluminum Oxide Using Configured Target

Another use of the new target design employs a flat 6"×20" titanium target that patterned so that a pyramid pattern on the target is machined with the angle of the sides of the pyramid at 60 degrees to the normal and the length of one side of the base of the pyramid at 0.5". Attached to the patterned target is the power switching mechanism. The power switching mechanism includes a computer controlled timing circuit such as a Soft PLC. The circuit has the ability to put out timing pulses in excess of 500 Hz. The timing circuit drives two banks of solid state relays (SSRs of SCRs). Each SSR has the ability to switch up to 500 Hz and handles up to 50 amps each. The SSRs are placed in parallel and each bank can be expanded to handle a desired amount of current. The SSR banks are placed on a water cooled cold plate to ensure proper cooling and operation. With the plasma initiator according to the exemplary embodiment in place on the metallic plasma source, a 99.99% pure titanium plate that patterned in the above manner and was 6" by 20" by 1" thick, and the timing PLC set to switch the current at a rate of 60 Hz, 200 amps from the power supply was supplied to the two SSR banks and the banks were attached to their respective power posts on the metallic target.

Figure 7:
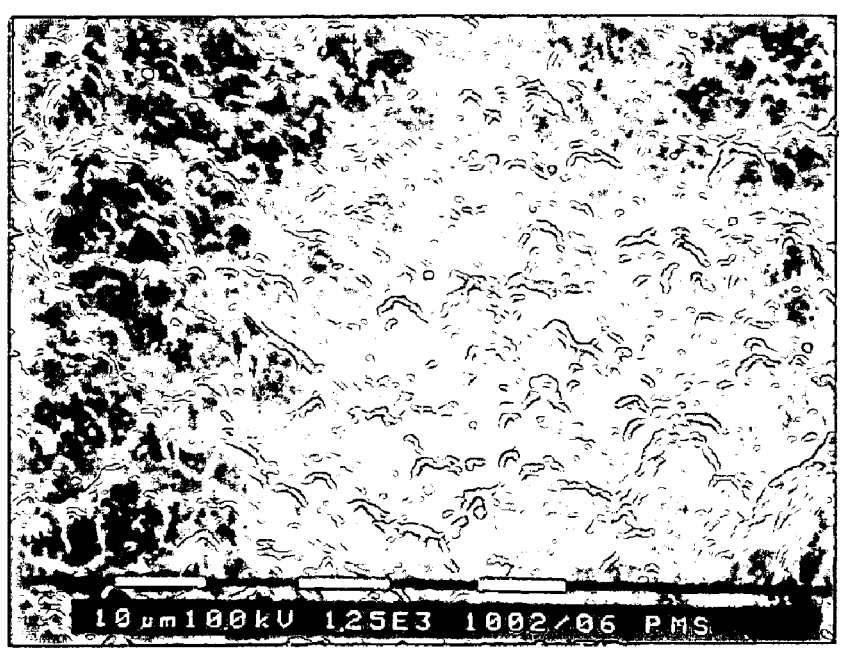
FIG. 7 is a scanning electron micrograph (SEM) of a titanium coating deposited on an aluminum oxide substrate using a pyramid patterned titanium target according to an embodiment of the present invention.

The plasma chamber was evacuated to a pressure of 4E-4 Torr, then backfilled with 99.99% pure argon gas at a flow rate of 500 SCCM to bring the chamber pressure up to 5E-3 Torr. The power supply and PLC were activated and the plasma was automatically initiated. The plasma was allowed to deposit for ten minutes on an aluminum oxide substrate that was 24" from the face of the plasma source. The chamber was vented to atmosphere and the sample was removed and analyzed by SEM. FIG. 7 shows the result of the SEM. The coating from the plasma was significantly different from the previous examples of planar sources with no patterning. As seen in FIG. 7, the coating is more amorphous with few distinct macroparticles.

It should be understood that the examples and embodiments described herein are for illustrative purposes only and that various modifications or changes in light thereof will be suggested to persons skilled in the art and are to be included within the spirit and purview of this application.

What is claimed is:

1. A power supply control unit, comprising:
    a plasma arc initiator device, wherein the plasma arc initiator device comprises:
        a solid state relay having one end connected to a positive terminal of the DC power supply;
        a resistor having a first end coupled to a second end of the solid state relay and a second end coupled to a negative terminal of the DC power supply, wherein when the solid state relay is in a closed position a short circuit occurs in a signal path of the solid state relay, the resistor and the DC power supply; and
        a cathode formed at the negative terminal of the DC power supply and electrically connected to the negative terminal of the DC power supply;
    a plurality of insulated Gate Bipolar Transistors (IGBTs), wherein a collector of each of the plurality of IGBTs is coupled to a DC power supply and an emitter of each of the plurality of IGBTs is coupled to a corresponding output for outputting power from the DC power supply; and
    at least one control circuit, wherein one of the at least one control circuit is coupled to a gate of a corresponding one or more of the plurality of IGBTs,
    wherein the at least one control circuit controls the corresponding one or more of the plurality of IGBTs to switch power supplied from the DC power supply from being output from one of the plurality of IGBTs to be output from another of the plurality of IGBTs.

2. The power supply control unit of claim 1, wherein the plasma arc initiator further comprises an anode at the positive side of the DC power supply and separated a predetermined distance from the cathode.

3. The power supply control unit of claim 2, wherein the plasma arc initiator cathode provides a point of contact on a target.

4. The power supply control unit of claim 3, wherein the plasma arc initiator point of contact consists of one or more conductive materials.

5. The power supply control unit of claim 1, wherein the plasma arc initiator further comprises:
    a material having a resistance, wherein the material has a first end coupled to the positive side of the DC power supply and a second end coupled to the negative side of the DC power supply.

6. The power supply control unit of claim 5, wherein the resistance of the plasma arc initiator material is slightly greater than or equal to a resistance of plasma formed between the cathode and an anode formed at the positive side of the DC power supply and separated a predetermined distance from the cathode.

7. The power supply control unit of claim 1, wherein the corresponding outputs of the plurality of IGBTs are connected to the cathode, wherein the plurality of IGBTs output the power from the DC power supply to the cathode according to a control signal from the at least one control circuit.

8. The power supply control unit of claim 1, further comprising:
    a cold plate coupled with a respective one of the at least one IGBT.

9. The power supply control unit of claim 1, wherein the DC power supply is capable of supplying a current up to 600 A and a DC voltage up to 20 V.

10. The power supply control unit of claim 1, wherein the at least one control circuit is a single control circuit coupled to all of the at least one IGBT.

11. The power supply control unit of claim 1, wherein each of the at least one control circuit is coupled to a corresponding one of the at least one IGBT.

\* \* \* \* \*

UNITED STATES PATENT AND TRADEMARK OFFICE
CERTIFICATE OF CORRECTION

PATENT NO.         : 7,920,369 B2
APPLICATION NO.    : 11/657222
DATED              : April 5, 2011
INVENTOR(S)        : Daniel M. Storey It is certified that error appears in the above-identified patent and that said Letters Patent is hereby corrected as shown below:

Column 2,
Line 22, "A "trigerless" initiator" should read --A "triggerless" initiator--.
Line 42, "macro particle" should read --macroparticles--.

Column 3,
Line 24, "address to at least" should read --address at least--.

Column 4,
Line 20, "52:39-50; (1992)" should read --52:39-50 (1992)--.
Line 39, "parts; is solid state," should read --parts, is solid state,--.
Line 42, "scaleup" should read --scale-up--.

Column 7,
Line 12, "52:39-50; (1992)" should read --52:39-50 (1992)--.

Column 11,
Line 6, "plasma are" should read --plasma arc--.

Signed and Sealed this
Second Day of August, 2011

David J. Kappos
*Director of the United States Patent and Trademark Office*

UNITED STATES PATENT AND TRADEMARK OFFICE
Certificate

Patent No. 7,920,369 B2　　　　　　　　　　　　　　　　　　　　　　Patented: April 5, 2011

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Daniel M. Storey, Longmont, CO (US); and Damon McCausland, Fort Collins, CO (US).

Signed and Sealed this Third Day of July 2012.

REXFORD BARNIE
*Supervisory Patent Examiner*
Art Unit 2836
Technology Center 2800